US012565066B2

(12) United States Patent
Lin et al.

(10) Patent No.: US 12,565,066 B2
(45) Date of Patent: Mar. 3, 2026

(54) PCB IMPEDANCE TUNING TO ACHIEVE WIDEBAND AND HIGH ACCEPTANCE OF COIL ANTENNA LENGTH VARIATION

(71) Applicant: The Goodyear Tire & Rubber Company, Akron, OH (US)

(72) Inventors: Cheng-Hsiung Lin, Hudson, OH (US); Daniel Harrist, Pittsburgh, PA (US); Jason Gill, Pittsburgh, PA (US)

(73) Assignee: The Goodyear Tire & Rubber Company, Akron, OH (US)

( * ) Notice: Subject to any disclaimer, the term of this patent is extended or adjusted under 35 U.S.C. 154(b) by 0 days.

(21) Appl. No.: 18/797,650

(22) Filed: Aug. 8, 2024

(65) Prior Publication Data

US 2025/0108669 A1 Apr. 3, 2025

Related U.S. Application Data

(60) Provisional application No. 63/587,313, filed on Oct. 2, 2023.

(51) Int. Cl.
B60C 23/04 (2006.01)
G06K 19/07 (2006.01)
(Continued)

(52) U.S. Cl.
CPC ...... B60C 23/0452 (2013.01); G06K 19/0708 (2013.01); G06K 19/0717 (2013.01); G06K 19/07764 (2013.01); G06K 19/07779 (2013.01); H03H 7/38 (2013.01); H05K 1/0243 (2013.01); H03H 2007/386 (2013.01); H05K 2201/10098 (2013.01); H05K 2201/10151 (2013.01)

(58) Field of Classification Search
CPC .................................................. B60C 23/0452
See application file for complete search history.

(56) References Cited

U.S. PATENT DOCUMENTS

| | | | |
|---|---|---|---|
| 5,181,975 A | 1/1993 | Pollack et al. | |
| 5,656,993 A | 8/1997 | Coulthard | |

(Continued)

FOREIGN PATENT DOCUMENTS

| | | | |
|---|---|---|---|
| CN | 107521294 A | 12/2017 | |
| EP | 1326202 A2 * | 7/2003 | ....... G06K 19/07749 |

OTHER PUBLICATIONS

Search Report for European application No. EP24203769.5 dated Jan. 24, 2025.

*Primary Examiner* — Davetta W Goins
*Assistant Examiner* — Pameshanand Mahase
(74) *Attorney, Agent, or Firm* — Edward T. Kennedy

(57) ABSTRACT

Disclosed are examples related to PCB impedance tuning for wideband operation and acceptance of antenna variation. In one example, a tire monitoring device includes a sensor, RFID circuitry and processing circuitry mounted on a PCB. The RFID circuitry can harvest energy and transmit monitored tire data in response to a received interrogation signal. The RFID circuitry can be tuned to receive interrogation signals in a frequency band from at least 868 MHz to at least 915 MHz to cover both NA and EU applications. Impedance matching of the RFID circuitry can enable operation independent of variations in coil antenna length. In another example, comprises the tire monitoring device and a RFID reader or interrogator.

15 Claims, 6 Drawing Sheets

(51) Int. Cl.
   *G06K 19/077*      (2006.01)
   *H03H 7/38*      (2006.01)
   *H05K 1/02*      (2006.01)

(56) References Cited

U.S. PATENT DOCUMENTS

| | | | |
|---|---|---|---|
| 6,951,139 B2 | 10/2005 | Reuter et al. | |
| 6,958,684 B2 | 10/2005 | Lin et al. | |
| 6,978,668 B2 | 12/2005 | Starinshak | |
| 6,978,669 B2 | 12/2005 | Lionetti et al. | |
| 7,284,418 B2 | 10/2007 | Yin et al. | |
| 8,910,513 B2 | 12/2014 | Toyofuku | |
| 9,987,888 B2 | 6/2018 | Li et al. | |
| 10,836,223 B1 | 11/2020 | Schessler et al. | |
| 10,935,466 B2 | 3/2021 | Lin et al. | |
| 11,260,705 B2 | 3/2022 | Spencer et al. | |
| 11,273,801 B2 | 3/2022 | Lin et al. | |
| 2005/0150286 A1 | 7/2005 | Kurtz et al. | |
| 2006/0025897 A1* | 2/2006 | Shostak | G06K 19/0717 |
| | | | 701/1 |
| 2008/0216567 A1* | 9/2008 | Breed | B60R 21/013 |
| | | | 73/146.5 |
| 2017/0110796 A1* | 4/2017 | Rokhsaz | H01Q 1/2216 |
| 2017/0206446 A1* | 7/2017 | Lesesky | G06K 19/07764 |
| 2018/0154708 A1 | 6/2018 | Yang et al. | |
| 2019/0001764 A1 | 1/2019 | Wagner et al. | |
| 2020/0070598 A1 | 3/2020 | Noel et al. | |
| 2021/0021015 A1* | 1/2021 | Fenkanyn | B60C 23/0493 |
| 2023/0161993 A1 | 5/2023 | Lin | |
| 2023/0202247 A1 | 6/2023 | Henriet et al. | |
| 2025/0030147 A1 | 1/2025 | Zhang et al. | |
| 2025/0070448 A1 | 2/2025 | Zhang et al. | |

* cited by examiner

| Sample preparation for Antenna tuning | | |
|---|---|---|
| coil pitch | 0.8 mm | Estimated Frequency |
| Sample # | Coil Length (mm) | MHz |
| #1 | 25 | 1045.3 |
| #2 | 29.8 | 915.3 |
| #3 | 31.5 | 869.3 |
| #4 | 35 | 774.5 |
| #5 | 42 | 585.0 |

Sample preparation for Antenna tuning

| coil pitch | 0.8 mm |
| --- | --- |
| Sample # | Coil Length (mm) |
| #1 | 25 |
| #2 | 29.8 |
| #3 | 31.5 |
| #4 | 35 |
| #5 | 42 |

Sample preparation for Antenna tuning

| coil pitch | 0.8 mm |
|---|---|
| Sample # | Coil Length (mm) |
| #1 | 25 |
| #2 | 29.8 |
| #3 | 31.5 |
| #4 | 35 |
| #5 | 42 |

PCB IMPEDANCE TUNING TO ACHIEVE WIDEBAND AND HIGH ACCEPTANCE OF COIL ANTENNA LENGTH VARIATION

BACKGROUND

Tire pressure monitoring has been considered by many tire manufacturers. A pressure transducer and electronic circuitry for transmitting pressure data, such as a transponder, can be mounted to an inner surface of the tire, to the wheel, or to a valve stem of the tire/wheel system. Although pressure transducers have been used in pneumatic tires for provision of the pressure data, these pressure-data systems have been plagued by difficulties inherent in the tire environment. Such difficulties include exposure of the pressure transducer and electronic components to the rugged conditions under which the tires operate and the ability to effectively and reliably couple RF signals into and out of the tire.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DEFINITIONS

Figure 1:
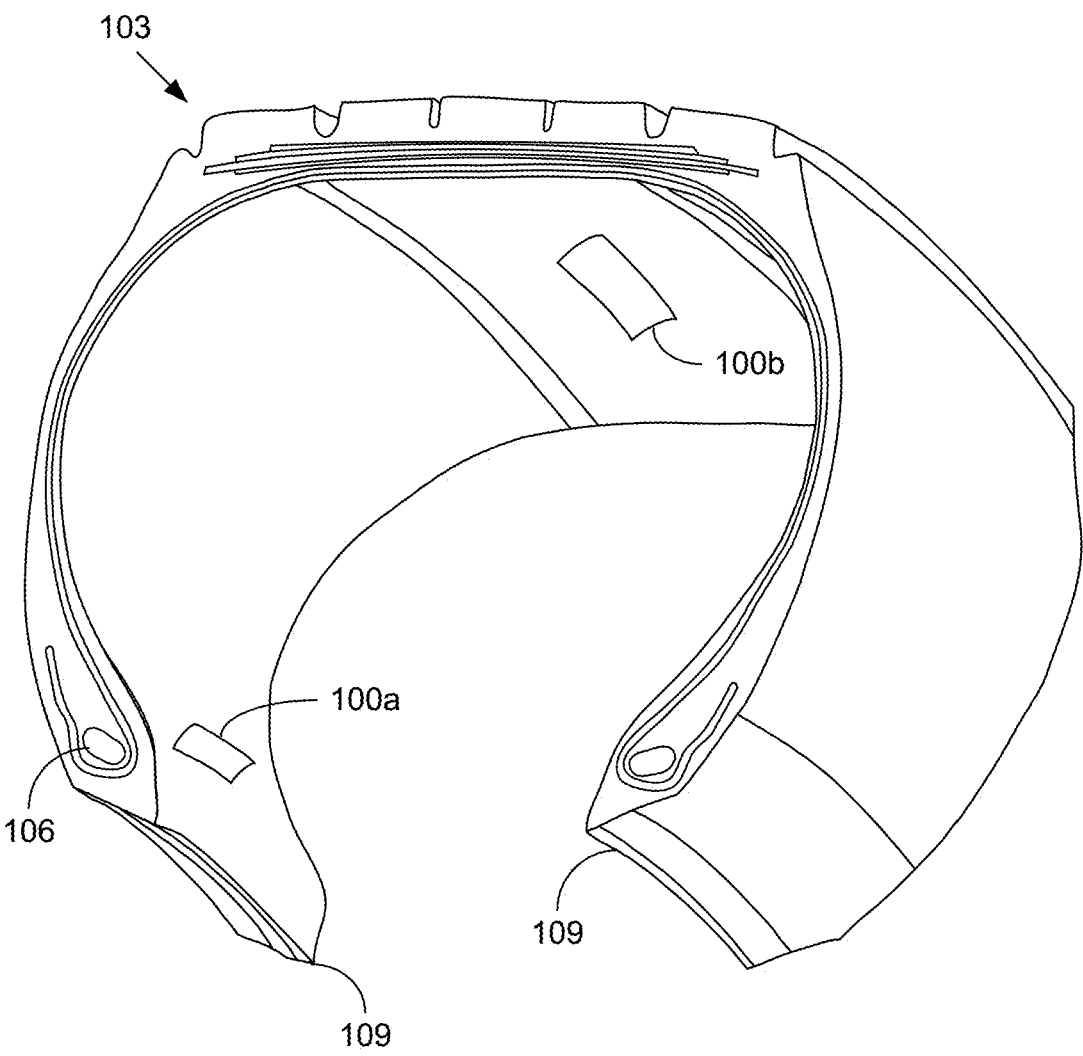
FIG. 1 is a partial cross-sectional view illustrating an example of a pneumatic tire with a monitoring device installed within the tire, in accordance with various embodiments of the present disclosure.

"Axial" and "axially" mean lines or directions that are parallel to the axis of rotation of the tire.

"Axially inward" and "axially inwardly" refer to an axial direction that is toward the axial center of the tire.

"Axially outward" and "axially outwardly" refer to an axial direction that is away from the axial center of the tire.

"Circumferential" means lines or directions extending along the perimeter of the surface of the annular tread perpendicular to the axial direction.

"Inboard side" means the side of the tire nearest the vehicle when the tire is mounted on a wheel and the wheel is mounted on the vehicle.

"Innerliner" means the layer or layers of elastomer or other material that form the inside surface of a tubeless tire and that contain the inflating fluid within the tire.

"Outboard side" means the side of the tire farthest away from the vehicle when the tire is mounted on a wheel and the wheel is mounted on the vehicle.

"Radial" and "radially" mean lines or directions that are perpendicular to the axis of rotation of the tire.

"Radially inward" and "radially inwardly" refer to a radial direction that is toward the central axis of rotation of the tire.

"Radially outward" and "radially outwardly" refer to a radial direction that is away from the central axis of rotation of the tire. "RFID" means radio frequency identification.

"TPMS" means a tire pressure monitoring system.

DETAILED DESCRIPTION

Disclosed herein are various examples related to printed circuit board (PCB) impedance tuning for wideband operation and acceptance of antenna variation. Reference will now be made in detail to the description of the embodiments as illustrated in the drawings, wherein like reference numbers indicate like parts throughout the several views.

Safe, efficient, and economical operation of a motor vehicle depends, to a significant degree, on maintaining the tires of the motor vehicle. For example, maintaining correct air pressure in all (each) of the tires can enhance vehicle performance. Failure to correct for faulty or abnormal (typically low) air pressure may result in excessive tire wear, poor gasoline mileage, steering difficulties, and even blowouts. A monitoring device can be used for monitoring, storing and telemetering information such as temperature, pressure, tire mileage and/or other operating conditions of a pneumatic tire, along with tire identification information. The monitoring device such as, e.g., a tire pressure monitoring system (TPMS) transponder module or other transponder module can be positioned within the tire to detect the operating conditions and communicate the information to an external device.

As used herein, a "transponder module," or more simply a "transponder," is an electronic apparatus (device) capable of monitoring a condition such as air pressure within a pneumatic tire, and then transmitting that information to an external device. Depending on the configuration, the external device can be an RF (radio frequency) reader/interrogator or an RF receiver. A simple receiver can be used when the transponder is "active" and has its own power source. A reader/interrogator can be used when the transponder is "passive" and powered by an RF signal received from the reader/interrogator. In either case, in conjunction with the external device, the transponder forms a component of an overall tire-condition monitoring/warning system. To send or receive RF signals, a transponder utilizes an antenna. This antenna may either be incorporated into the transponder module itself, or it may be external to the transponder module and electrically connected or coupled to it in a suitable manner.

FIG. 1 is a partial cross-sectional view of an example of a pneumatic tire with monitoring devices 100a and 100b installed at two alternative locations within the cavity of the pneumatic tire 103. Monitoring device 100a is secured to the inner wall in the vicinity of the tire bead 106 below the end of the body ply turn-up where the sidewall bending stiffness is greatest and where the rolling tire stresses are at a minimum. The monitoring device 100a can be positioned at a defined distance from a toe bottom 109 of the tire 103, which can vary with the type and size of the tire. For example, the monitoring device 10a can be located with the pressure sensor about 2.5 inches to about 3 inches, or about 2.75 inches, from the toe bottom 109. Monitoring device 100b is secured to the inside of the tire 103 at the center of the tread crown where tire stresses from mounting and dismounting are at a minimum. A monitoring device 100 can also be installed at other locations within the tire 103.

For a passive TPMS, the monitoring device (e.g., TPMS transponder) 100 can comprise, e.g., a microchip or microcontroller, an antenna, and one or more sensors such as, e.g., a pressure sensor, a temperature sensor, and/or a mileage/distance sensor. The monitoring device 100 can also include RFID circuitry that can harvest energy from received RF signals from an RF reader/interrogator and transmit monitored tire data back to the RF reader/interrogator. The components of the monitoring device (e.g., TPMS transponder) 100 can be mounted on a PCB for installation in the tire 103 and can be encapsulated for protection during use.

Figure 2:
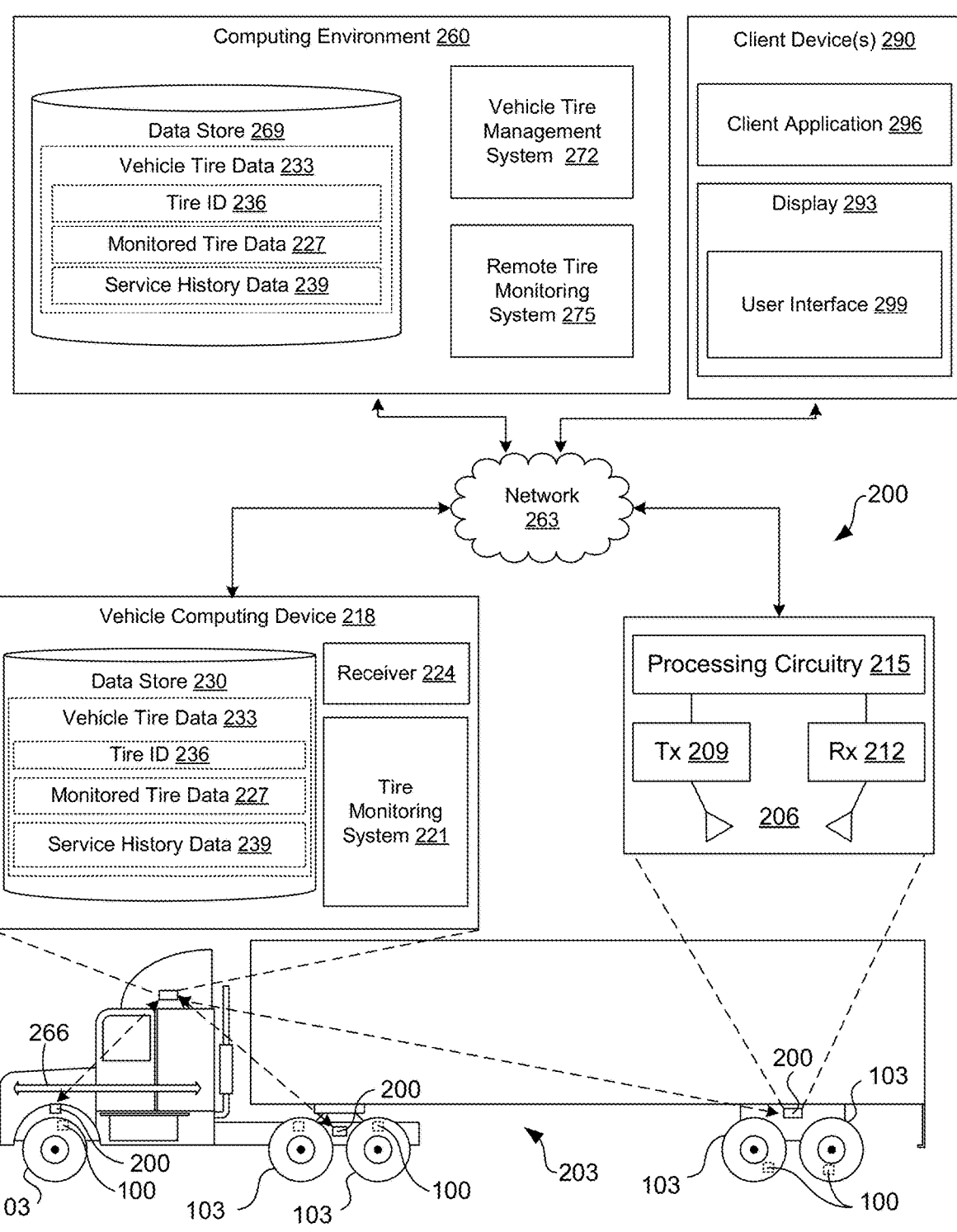
FIG. 2 is a schematic diagram illustrating an example of a passive monitoring system on a vehicle, in accordance with various embodiments of the present disclosure.

FIG. 2 is a schematic block diagram illustrating an example of a passive monitoring system 200 on a vehicle 203. The passive monitoring system 200 includes one or more tires 103 with a monitoring device (e.g., TPMS transponder) 100 installed. The passive monitoring system 200 also includes one or more RF reader/interrogators 206 located adjacent to the tire(s) 103 to obtain monitored tire data from the installed monitoring device (e.g., TPMS transponder) 100.

As illustrated in FIG. 2, the RF reader/interrogator 206 can include a transmitter 209, a receiver 212 (or a transceiver) and processing circuitry 215 for controlling the transmission of the RF signal and processing of the RF signals received from the monitoring device (e.g., TPMS transponder) 100. The processing circuitry 215 can comprise a processor and memory or other processing circuitry as needed. The RF signal can be transmitted by the transmitter 209 (or transceiver) via an antenna or antenna array, which can direct the RF signal to a tire 103 or a portion of the tire 103, and the response of the monitoring device (e.g., TPMS transponder) 100 can be received by the receiver 212 (or transceiver) via the same or another antenna or antenna array.

The RF reader/interrogator 206 can be communicatively coupled to a vehicle computing device 218. The vehicle computing device 218 can comprise a processor circuit that executes, for example, a tire monitoring system 221 and/or other applications. The vehicle computing device 218 can also include a receiver 224 for obtaining monitored tire data 227 transmitted from the RF reader/interrogator 206. The processing circuitry 215 can include an antenna (not shown) for wirelessly transmitting monitored tire data 227 to a remote processor for analysis, such as the vehicle computing device 218. In this respect, the RF reader/interrogator 206 may include appropriate communications capabilities (e.g., Wi-Fi, BLUETOOTH®, etc.) to link to the vehicle computing device 218. By communicating the monitored tire data 227 to the vehicle computing device 218, the complexity, and thus the cost, of the RF reader/interrogator 206 can be reduced.

In the case that the vehicle 203 comprises a tractor-trailer, a vehicle computing device 218 may be located on the back of the trailer so as to be within range of wireless communication with the RF reader/interrogator 206. In various examples, the vehicle computing device 218 can include a communication system to facilitate communication with a computing environment 260 over the network 263. In this respect, the vehicle computing device 218 may include appropriate communications capabilities to link to a cellular network, Wi-Fi network, BLUETOOTH® network, microwave transmission network, radio broadcast networks, or other communication networks.

Also, various data can be stored in a data store 230 that is accessible to the vehicle computing device 218. The data store 230 may be representative of a plurality of data stores 230 as can be appreciated. The data stored in the data store 230, for example, can be associated with the operation of the various applications and/or functional entities described below. Such information can be stored, for example, as vehicle tire data 233 in a memory associated with the vehicle computing device 218 and can include a tire identifier 236 and service history data 239 in addition to the monitored tire data 227, manufacturing information for the tire 103 (e.g., manufacture name, tire model, etc.), tire size information (e.g., rim size, width, and outer diameter, etc.), manufacturing location, manufacturing date, and/or other information about the tires 103.

The tire monitoring system 221 can communicate with the processing circuitry 215 of the RF reader/interrogator 206 periodically to obtain information (e.g., the monitored tire data 227) from the RF reader/interrogator 206. Such information can be stored, for example, as vehicle tire data 230 in a memory associated with the vehicle computing device 218. In addition, the tire monitoring system 221 can include a timestamp in each monitored tire data record to indicate when the data were read from the respective monitoring device (e.g., TPMS transponder) 100. Alternatively, the processing circuitry 215 may generate a timestamp at the time it obtains the monitored tire data from the monitoring device 100.

While the vehicle 203 is depicted as a commercial truck with trailer in FIG. 2, the vehicle 203 may comprise any type of vehicle that employs tires where the commercial truck is presented as an example. To this end, the vehicle 203 may comprise other vehicles falling into various categories such as aircraft, passenger vehicles, off-road vehicles, commercial trucks, light trucks and the like, in which such vehicles 203 include a greater or lesser number of tires 103 than are shown in FIG. 2.

FIG. 2 illustrates an example of a networked environment according to various embodiments. The networked environment includes the computing environment 260, a client device 290, and the vehicle 203, which are in data communication with each other via the network 263. The vehicle 203 can include one or more vehicle computing devices 218, one or more RF reader/interrogators 206, and a Controller Area Network (CAN) bus 266 that facilitates data communication between various systems on the vehicle 203. In one embodiment, the vehicle computing device(s) 218 are coupled to the CAN bus 266 and may communicate with systems included on the CAN bus 266.

The network 263 can include wide area networks (WANs), local area networks (LANs), personal area networks (PANs), or a combination thereof. These networks can include wired or wireless components or a combination thereof. Wired networks can include Ethernet networks, cable networks, fiber optic networks, and telephone networks such as dial-up, digital subscriber line (DSL), and integrated services digital network (ISDN) networks. Wireless networks can include cellular networks, satellite networks, Institute of Electrical and Electronic Engineers (IEEE) 802.11 wireless networks (i.e., WI-FI®), BLUETOOTH® networks, microwave transmission networks, as well as other networks relying on radio broadcasts. The network 263 can also include a combination of two or more networks 518. Examples of networks 263 can include the Internet, intranets, extranets, virtual private networks (VPNs), and similar networks.

The computing environment 260 may comprise, for example, a server computer or any other system providing computing capability. Alternatively, the computing environment 260 may employ a plurality of computing devices that may be arranged, for example, in one or more server banks or computer banks or other arrangements. Such computing devices may be located in a single installation or may be distributed among many different geographical locations. For example, the computing environment 260 may include a plurality of computing devices that together may comprise a hosted computing resource, a grid computing resource, and/or any other distributed computing arrangement. In some cases, the computing environment 260 may correspond to an elastic computing resource where the allotted capacity of processing, network, storage, or other computing-related resources may vary over time.

Various applications and/or other functionality may be executed in the computing environment 260 according to various embodiments. Also, various data is stored in a data store 269 that is accessible to the computing environment 260. The data store 269 may be representative of a plurality of data stores 269 as can be appreciated. The data stored in the data store 269, for example, can be associated with the operation of the various applications and/or functional entities.

The data stored in the data store 269 can include, for example, vehicle tire data 233 and potentially other data. The vehicle tire data 233 can also include information for each specific tire 103. For example, the vehicle tire data 233 may include a tire identifier 236, manufacturing information for the tire 103 (e.g., manufacture name, tire model, etc.), tire size information (e.g., rim size, width, and outer diameter, etc.), manufacturing location, manufacturing date, and/or other information. The vehicle tire data 233 may also include a service history data 239 or other information to identify specific features and parameters of each tire 103. The vehicle tire data 233 can further include monitored tire data 227 acquired from the RF reader/interrogator 206 on the vehicle 203, and/or other data.

The components executed on the computing environment 260, for example, can include a vehicle tire management system 272, a remote tire monitoring system 275, and other applications, services, processes, systems, engines, or functionality not discussed in detail herein. The vehicle tire management system 272 can be executed to track the location and status of tires 103 mounted on a plurality of vehicles 203. Such a vehicle tire management system 272 may track hundreds if not thousands of tires 103 on many vehicles 203. The vehicle tire management system 272 can indicate to users and/or operators when tires 103 may need to be serviced, replaced, or the vehicle tire management system 272 may provide other information.

The remote tire monitoring system 275 can be executed to detect a condition or fault of a tire 103 by monitoring the monitored tire data 227 obtained from the RF reader/interrogator 206 on the vehicles 203. In various examples, the remote tire monitoring system 275 can detect an issue with a tire 103 based upon analysis of the monitored tire data 227. In various examples, tire maintenance and/or replacement can be initiated or scheduled based upon the analysis.

In one or more examples, upon detecting an issue with the tire 103, the remote tire monitoring system 275 can generate an alert notification indicating the detected issue. The alert notification can be a visual alert (e.g., user interface, indicator light on vehicle, etc.) or an audio alert, as can be appreciated. In some examples, the remote tire monitoring system 275 can transmit the alert notification to a computing device associated with the vehicle 203 and/or user of the vehicle, a client device 290, one or more vehicle computing devices 218, and/or another device. In some examples, upon detecting the issue, the remote tire monitoring system 275 can notify the vehicle tire management system 272 of the issue such that the vehicle tire management system 272 can proceed with sending a notification to the user or associate associated with the vehicle 203.

In various examples, the tire monitoring system 221 can be executed to implement the functionalities of the remote tire monitoring system 275. For example, the tire monitoring system 221 can be executed to detect a fault in a tire 103 from the monitored tire data provided by the RF reader/interrogator 206 and transmitted to the receiver 224.

The client device 290 is representative of a plurality of client devices 290 that may be coupled to the network 263. The client device 290 may comprise, for example, a processor-based system such as a computer system. Such a computer system may be embodied in the form of a desktop computer, a laptop computer, personal digital assistants, cellular telephones, smartphones, set-top boxes, music players, web pads, tablet computer systems, game consoles, electronic book readers, smartwatches, head mounted displays, voice interface devices, or other devices. The client device 290 may include a display 293. The display 293 may comprise, for example, one or more devices such as liquid crystal display (LCD) displays, gas plasma-based flat panel displays, organic light emitting diode (OLED) displays, electrophoretic ink (E ink) displays, LCD projectors, or other types of display devices, etc.

The client device 290 may be configured to execute various applications such as a client application 296 and/or other applications. The client application 296 may be executed in a client device 290, for example, to access network content served up by the computing environment 260, vehicle computing device 218, RF reader/interrogator 206 on a vehicle 203, and/or other servers or systems, thereby rendering a user interface 299 on the display 293. To this end, the client application 296 may comprise, for example, a browser, a dedicated application, etc., and the user interface 299 may comprise a network page, an application screen, etc. The client device 290 may be configured to execute applications beyond the client application 296 such as, for example, email applications, social networking applications, word processors, spreadsheets, and/or other applications.

Figure 3:
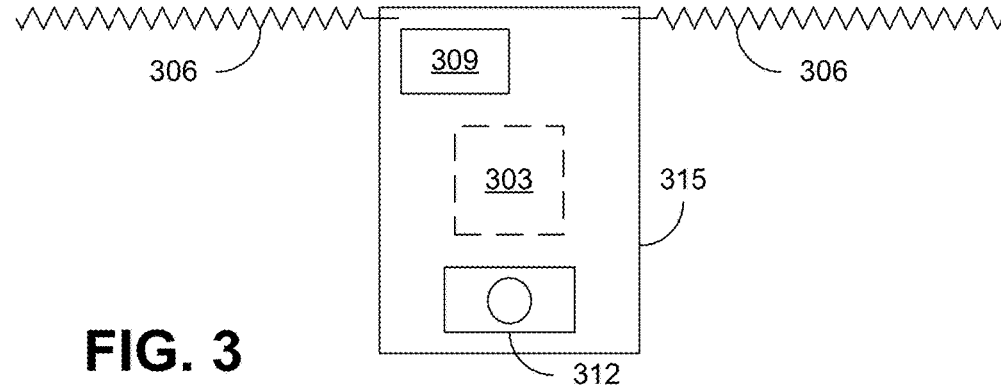
FIG. 3 is a schematic diagram illustrating an example of a monitoring device that can be used with the passive monitoring system of FIG. 2, in accordance with various embodiments of the present disclosure.

Referring to FIG. 3, shown is a schematic diagram illustrating an example of a monitoring device (e.g., TPMS transponder) 100 that can be used for passive monitoring of tire conditions. The monitoring device 100 can comprise, e.g., a microcontroller unit (MCU) or microchip 303, an antenna 306 (e.g., a coil antenna including two coils), RFID circuitry 309, one or more sensors 312 (e.g., a pressure sensor, a temperature sensor, and/or a mileage/distance sensor) and other circuitry as needed (e.g., comparator, boost converter, etc.). The RFID circuitry 309 can be configured to harvest energy from received RF signals from an RF reader/interrogator 200 (FIG. 2) and transmit monitored tire data back to the RF reader/interrogator 200. The MCU or microchip 303 can include interface circuitry (e.g., BLUETOOTH®, WI-FI®, etc.) configured to enable the monitoring device 100 to communicate with the vehicle computing device 218 or computing environment 260 via the network 263. The components of the monitoring device 100 can be mounted on a PCB 315 (on one or both sides) for installation in the tire 103, and the monitoring device 100 can be encapsulated for protection during use.

Although pressure transducers have been used in pneumatic tires, TPMS transponders and other monitoring devices 100 for tires are often plagued by difficulties inherent in the tire environment. Such difficulties include effectively and reliably coupling RF signals into and out of the tire, the rugged use the tire and electronic components are subjected to, as well as the possibility of deleterious effects on the tire from incorporation of the pressure transducer and electronics in a tire/wheel system. Placement of the monitoring device 100 (e.g., TPMS transponder) in the tire 103 as shown in FIG. 1 and characteristics of the tire materials can greatly affect the ability of the monitoring device 100 to communicate with the RF reader/interrogator 200. In addition, the component layout of the monitoring device on the PCB and antenna construction (e.g., coil length, coil pitch, coil diameter, etc.) can influence the RF coupling between the monitoring device 100 and the RF reader/interrogator 200.

Some of the effects on the RF coupling can be reduced by tuning the RFID circuitry 309 to account for the placement of the monitoring device 100 and specific characteristics of the tire 103. This can be accomplished by impedance matching, which is the practice of designing or adjusting the input impedance or output impedance of an electrical device for a desired value. Often, the desired value is selected to maximize power transfer or minimize signal reflection. For example, impedance matching can be used to improve power transfer from a RF transmitter via the interconnecting transmission line to the antenna. Signals on a transmission line will be transmitted without reflections if the transmission line is terminated with a matching impedance.

Impedance matching can be used to adjust the network of lumped element resistance, capacitance and inductance in the RFID circuitry 309. It should be noted that the circuit layout and placement of the lumped elements on the PCB 315 can also affect the impedance matching. Practical impedance matching will generally provide the best results over a specified frequency band. TPMS transponders are normally tuned for operation at the allowed UHF frequency (e.g., 915 MHz for North American (NA) applications or 868 MHz for European Union (EU) applications).

Traditionally, UHF passive sensor development includes impedance matching for the transponder component layout on the PCB 315. It also includes proper selection of the antenna length for the transponder operating frequency (915 MHz or 868 MHz). The transponder response frequency is very sensitive to antenna length and dielectric properties of nearby materials. For a coil antenna, the coil pitch can also strong influence the performance and frequency bandwidth. This becomes apparent during manufacturing where variations in construction and length of the fabricated antenna can occur. In addition, assembly of the monitoring device 100 can produce variations in the antenna length which can affect the already narrow RF bandwidth. Mounting of the monitoring device 100 on the tire 103 during manufacturing can also result in changes in the transponder operation.

With accurate measurement of the dielectric properties of the materials used to fabricate the monitoring device 100 and the tire materials near the monitoring device 100, the design of the RFID circuitry 309 can be determined. For example, the component values for impedance matching can be determined through an iterative process. Placement of the components on the PCB 315 can also be adjusted during the process. For fine tuning of the antenna length, a plurality of monitoring devices 100 with different antenna lengths can be fabricated and tested over a range of frequencies including the desired operational frequency. Each of the monitoring devices 100 can be encapsulated with the desired material (e.g., rubber) and fully cured. The encapsulated transponders can then be placed at the desired mounting location on a tire 103 (or in a section of a tire) for testing.

A frequency scan of each of the monitoring devices 100 can be performed using a vector network analyzer to determine performance. A fixed power output can be applied from the analyzer and the return signal (or return loss) detected and recorded. Alternatively, the minimum energy required to activate the monitoring device 100 can be determined and recorded. The scanning range should be broad enough to cover potential applications. An optical antenna length can be determined by the frequency and bandwidth for each monitoring device 100 having the lowest loss or activation energy.

Figure 4:
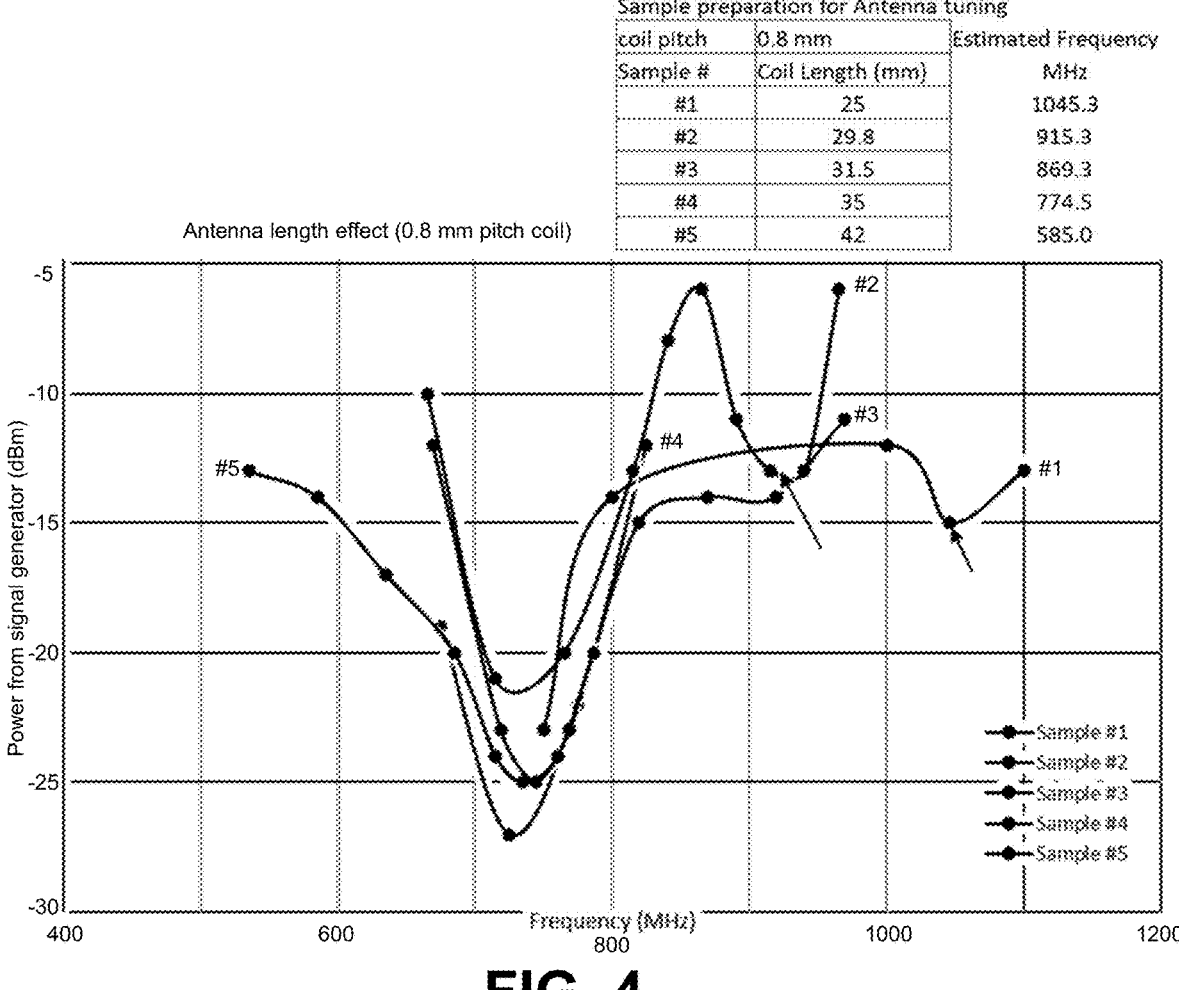
FIG. 4 illustrates an example of testing carried out on monitoring devices with different coil antenna lengths, in accordance with various embodiments of the present disclosure.

FIG. 4 illustrates an example of testing carried out on 5 monitoring devices 100 fabricated with different coil antenna lengths (25 mm, 29.8 mm, 31.5 mm, 35 mm, and 42 mm) with the same coil pitch. The estimated frequencies indicated that samples #2 and #3 should correspond to UHF frequencies of 915 and 868 MHz, respectively, as required in North American and the EU. The samples were scanned over a wide range of frequencies from 500 MHz to 1100 MHz. As can be seen, the results of samples #1 and #2 matched the predicted frequency. Sample #3 exhibited an extended plateau that extended across the estimated frequency.

However, when the scan results in FIG. 4 were compared, a wideband region was discovered at much lower frequencies that is insensitive to variations in the antenna length and exhibited better performance. Moreover, the bandwidth is wide enough to cover both the 868 and 915 MHz (UHF) applications in NA and EU. Many advantages are offered by utilizing this wideband. If the frequency range can be shifted, then a single monitoring device design can be used for tires in both NA and EU. This can also reduce the effect of manufacturing variations of the monitoring devices 100. In addition, variations in the antenna length will no longer be an important consideration.

Figure 5:
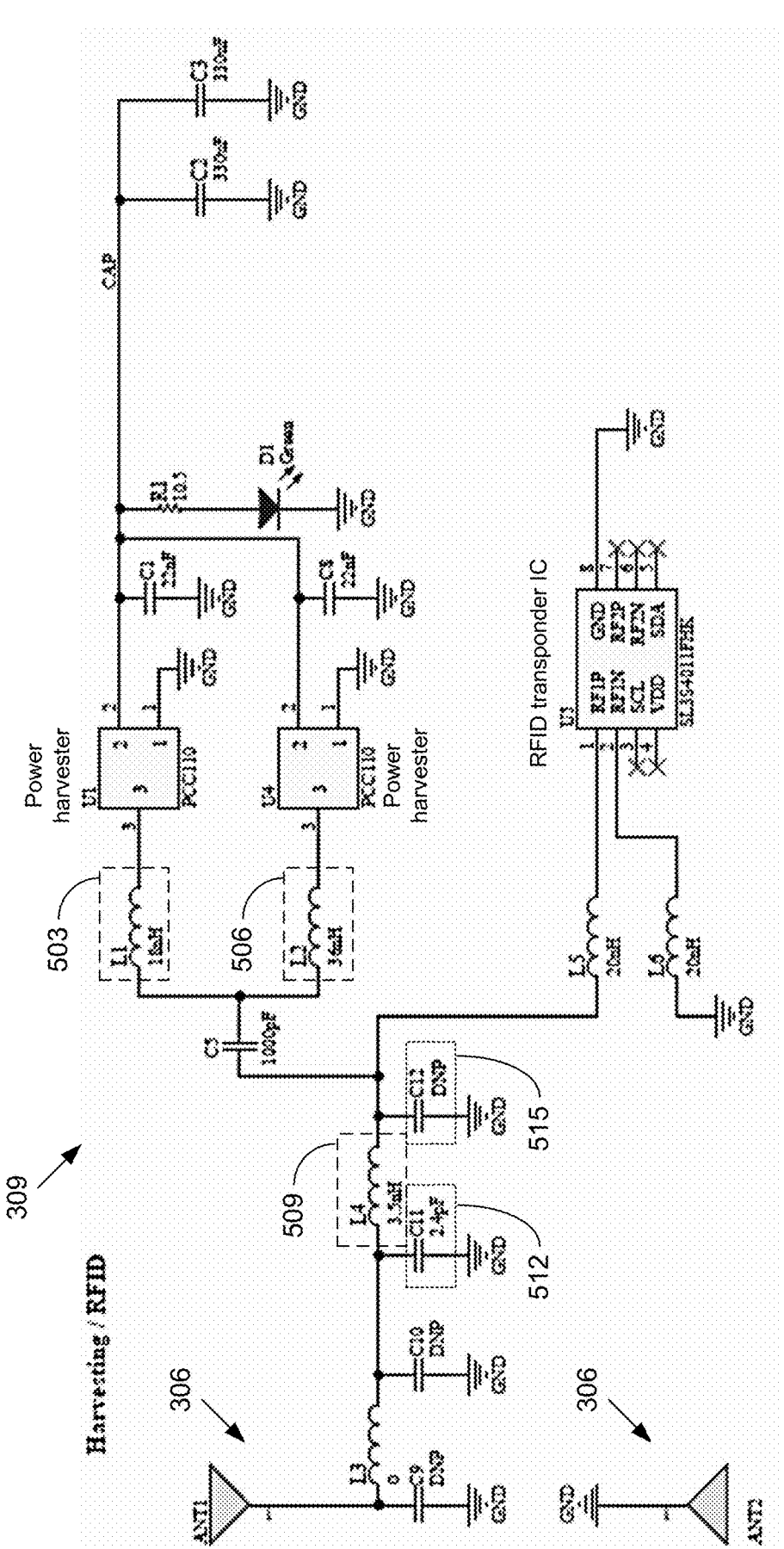
FIG. 5 is a schematic diagram illustrating an example of RFID circuitry of a monitoring device of FIG. 3, in accordance with various embodiments of the present disclosure.

By changing the components of the RFID circuitry 309 on the PCB 315, it is possible to shift the band to a higher frequency range suitable for UHF applications at both 868 and 915 MHz. It was found that the wideband response remained, and the loss change continued to be low, with the shift in frequencies. FIG. 5 is a schematic diagram illustrating an example of a RFID circuitry 309 of a monitoring device 100 (e.g., a TPMS transponder). By properly adjusting the inductors and capacitors of the RFID circuitry 309 on the PCB, it is possible to shift the frequency response to cover the range between 868 and 915 MH. The monitoring device performance and bandwidth can be iteratively evaluated to determine the proper component sizes. The frequency band was adjusted toward to 868 MHz due to UHF regulation on transmitter power limitation (4 W for 915 MHz in NA and 2 W for 868 MHz in the EU).

As illustrated in the example of FIG. 5, the RFID circuitry 309 comprises power harvesting chips and a RFID transponder integrated circuit (IC) which are coupled to coil antennas 306 through a matching network of lumped element components comprising capacitors and inductors. The lumped element components can be tuned to provide impedance matching with the power harvesting components over the desired frequency band while maintaining low return loss or activation energy. For dual operation in NA and EU, the desired frequency band can extend from about 868 MHz to about 915 MHz or can extend beyond this range.

As shown in FIG. 5, the matching network comprises a combination of inductors and capacitors connected between the coil antenna 306 and the power harvesting chips. In the example of FIG. 5, the matching network includes first and second inductors L1 and L2 (503 and 506) coupled to an RF input of the power harvesting chips. The first and second inductors L1 and L2 (503 and 506) can be connected to the coil antenna 306 through one or more LC filters and a series-connected capacitor C5. The LC filters can be implemented as T and/or pi filters including, e.g., a third inductor L3 connected in series with capacitors C9 and C10 connected to ground and a fourth inductor L4 (509) connected in series with capacitors C11 (512) and C12 (515) connected to ground. The RF input of the RFID transponder IC is also coupled to the LC filters and the coil antenna 306 by a fifth inductor L5.

During the tuning of the matching network, it was found that removing capacitor C12 (515) and adding capacitor C11 (512) and changing the inductance of inductors L1 (503), L2 (506) and L4 (509), allowed the desired shift in the frequency band to be achieved. In the fabricated implementations, the inductances of L1 (503), L2 (506), and L4 (509) were changed. In addition, the capacitance of C12 (515) was removed and a capacitance was added as capacitor C11 (512). The capacitance and inductance of the other elements of the RFID circuitry 309 are shown in FIG. 5. The matching network elements can be positioned on the PCB 315 to reduce interference with other components. As shown in FIG. 3, the RFID circuitry 309 can be assembled in a portion of the PCB 315 adjacent to the coil antenna 306.

Figure 6A:
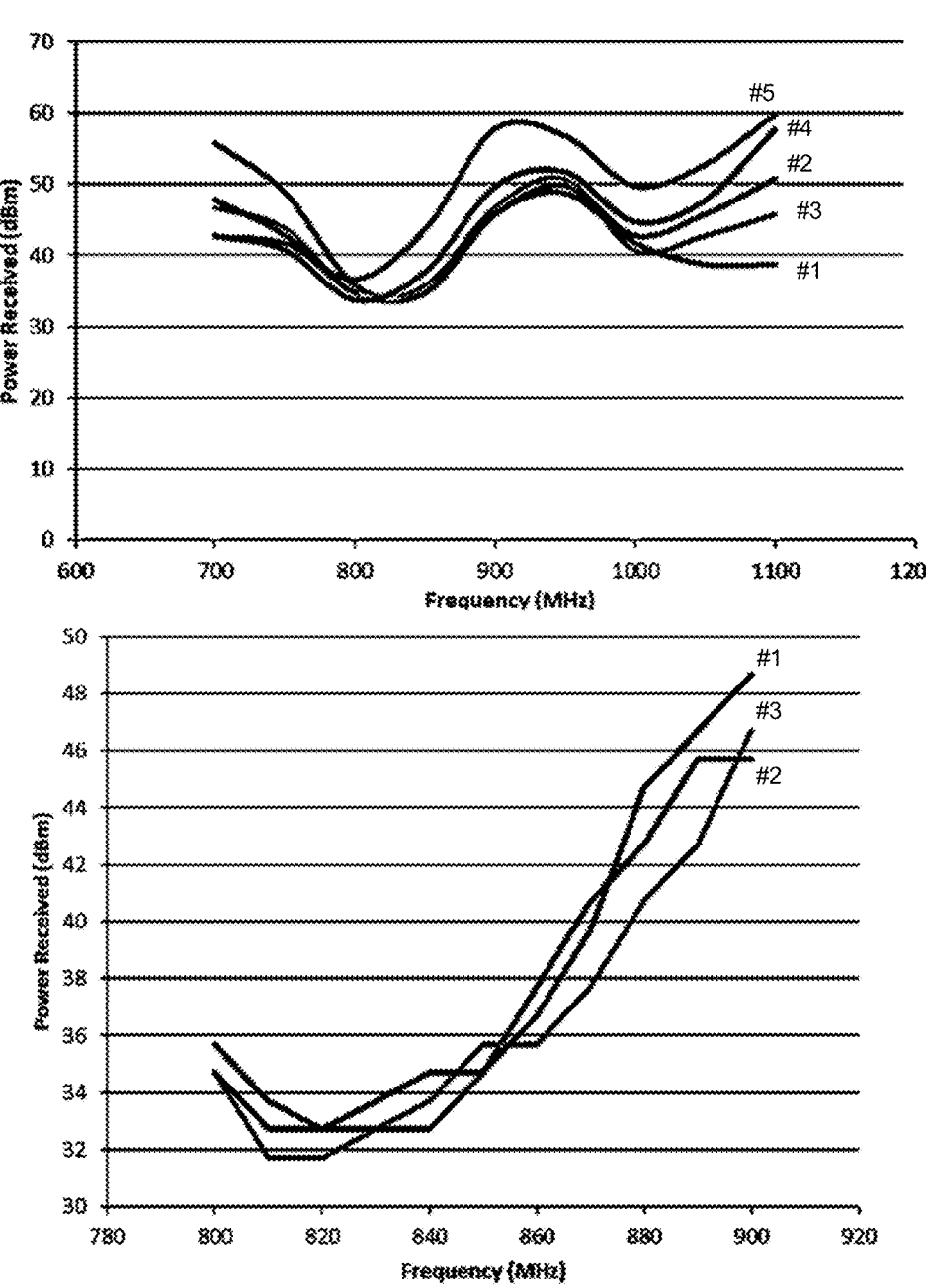
FIGS. 6A and 6B illustrate examples of testing carried out on monitoring devices with the modified RFID circuitry and different coil antenna lengths, in accordance with various embodiments of the present disclosure.
Figure 6B:
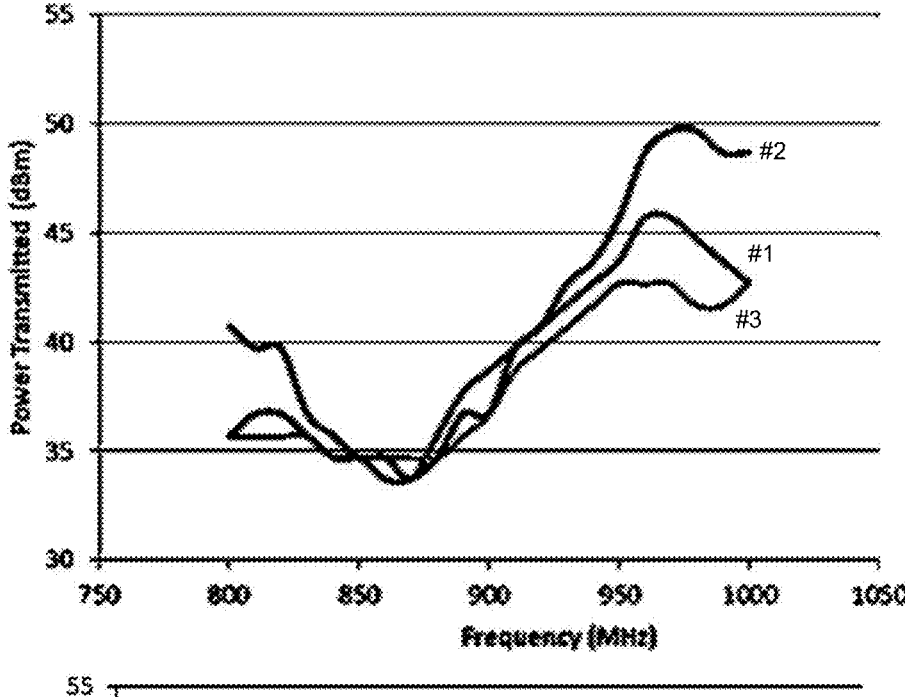
Figure 6B:
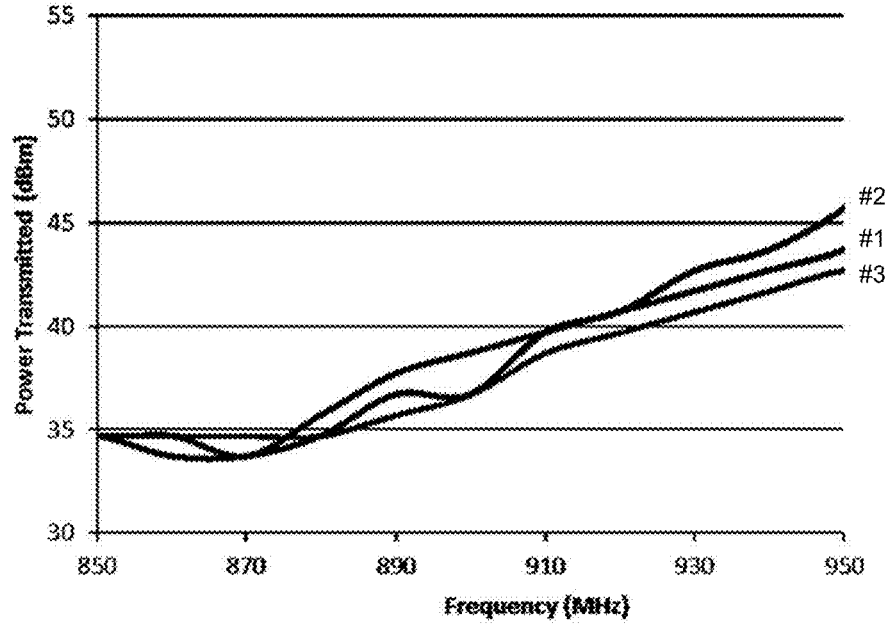

FIGS. 6A and 6B illustrate examples of testing carried out on 5 monitoring devices 100 fabricated with the modified RFID circuitry 309 and different coil antenna lengths (25 mm, 29.8 mm, 31.5 mm, 35 mm, and 42 mm) with the same coil pitch. As discussed, the bandwidth extended from at least 868 MHz to at least 915 MHz and the response was adjusted toward to 868 MHz due to UHF regulation on transmitter power limitation (4 W for 915 MHz in NA and 2 W for 868 MHz in the EU). FIG. 6A illustrates measurement of power received by the different monitoring devices 100 over the tested frequency range. As can be seen, the effect of variations in the antenna length are minimized by the tuning of the matching network. FIG. 6B illustrates the power transmitted. Again, variations in the antenna length had little effect on the operation.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A tire monitoring device, comprising:
at least one sensor mounted on a printed circuit board (PCB), the at least one sensor configured to detect at least one condition of a tire;
radio frequency identification (RFID) circuitry mounted on the PCB, the RFID circuitry coupled to a coil antenna mounted on the PCB, the RFID circuitry configured to harvest energy and transmit monitored tire data in response to a received interrogation signal, where the RFID circuitry is tuned to receive a radio frequency (RF) interrogation signals in a frequency band from at least 868 MHz to at least 915 MHz;
wherein the RFID circuitry comprises a matching network that couples the coil antenna to energy harvesting circuitry and RFID transponder circuitry, the matching network configured for impedance matching over the frequency band;
wherein the energy harvesting circuitry comprises energy harvesting chips coupled to the matching network;
wherein the matching network comprises at least one LC filter connected to the coil antenna and an LC circuit connecting the energy harvesting circuitry to the at least one LC filter; and
processing circuitry mounted on the PCB, the processing circuitry configured to obtain the monitored tire data from the at least one sensor in response to a received interrogation signal and provide the monitored tire data for transmission by the RFID circuitry.

2. The tire monitoring device of claim 1, wherein the LC circuit comprises an inductor coupled to each RF input of the energy harvesting circuitry and the at least one LC filter consists of an inductor coupled in series between the coil antenna and the LC circuit and a capacitor coupled between an end of the inductor adjacent to the coil antenna and ground.

3. The tire monitoring device of claim 1, wherein the matching network is configured to reduce return loss or activation energy over the frequency band independent of variations in coil antenna length.

4. The tire monitoring device of claim 1, wherein the energy harvesting circuitry comprises a plurality of energy harvesting chips.

5. The tire monitoring device of claim 1, wherein the RFID transponder circuitry comprises a RFID transponder integrated circuit (IC).

6. The tire monitoring device of claim 1, wherein the tire monitoring device is encapsulated in rubber.

7. A system, comprising:
a tire monitoring device comprising radio frequency identification (RFID) circuitry mounted on a printed circuit board (PCB) and coupled to a coil antenna mounted on the PCB, the RFID circuitry configured to harvest energy and transmit monitored tire data in response to a received interrogation signal, where the RFID circuitry is tuned to receive interrogation signals in a frequency band from at least 868 MHz to at least 915 MHz;
wherein the RFID circuitry comprises a matching network that couples the coil antenna to energy harvesting circuitry and RFID transponder circuitry, the matching network configured for impedance matching over the frequency band;
wherein the matching network comprises at least one LC filter connected to the coil antenna and an LC circuit connecting the energy harvesting circuitry to the at least one LC filter; and
a radio frequency (RF) interrogator configured to transmit an RF interrogation signal to obtain the monitored tire data from the tire monitoring device, the interrogation signal transmitted at a frequency of about 868 MHz or about 915 MHz, where the monitored tire data is communication to at least one computing device in response to an inquiry.

8. The system of claim 7, wherein the tire monitoring device is installed in a cavity of a tire mounted on a vehicle and the at least one computing device comprises a vehicle computing device.

9. The system of claim 8, wherein the tire monitoring device is encapsulated in rubber and mounted to an inner surface of the tire.

10. The system of claim 8, wherein the RF interrogator is communicatively coupled to the vehicle computing device via a wireless link.

11. The system of claim 10, wherein the wireless link is a Bluetooth® link.

12. The system of claim 7, wherein the tire monitoring device, comprises:

at least one sensor mounted on the PCB, the at least one sensor configured to detect at least one condition of a tire; and processing circuitry mounted on the PCB, the processing circuitry configured to obtain the monitored tire data from the at least one sensor in response to the received RF interrogation signal and provide the monitored tire data for transmission by the RFID circuitry.

13. The tire monitoring device of claim 7, wherein the LC circuit comprises an inductor coupled to each RF input of the energy harvesting circuitry and the at least one LC filter consists of an inductor coupled in series between the coil antenna and the LC circuit and a capacitor coupled between an end of the inductor adjacent to the coil antenna and ground.

14. The system of claim 7, wherein the matching network is configured to reduce return loss or activation energy over the frequency band independent of variations in coil antenna length.

15. The system of claim 7, wherein the energy harvesting circuitry comprises a plurality of energy harvesting chips and the RFID transponder circuitry comprises a RFID transponder integrated circuit (IC).

* * * * *